US006784976B2

(12) United States Patent
Coston et al.

(10) Patent No.: US 6,784,976 B2
(45) Date of Patent: Aug. 31, 2004

(54) SYSTEM AND METHOD FOR IMPROVING LINE WIDTH CONTROL IN A LITHOGRAPHY DEVICE USING AN ILLUMINATION SYSTEM HAVING PRE-NUMERICAL APERTURE CONTROL

(75) Inventors: Scott D. Coston, New Milford, CT (US); James G. Tsacoyeanes, Southbury, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 10/127,506

(22) Filed: Apr. 23, 2002

(65) Prior Publication Data

US 2003/0197846 A1 Oct. 23, 2003

(51) Int. Cl.[7] .......................... G03B 27/54; G03B 27/42
(52) U.S. Cl. ........................................ 355/67; 355/53
(58) Field of Search .............................. 355/52, 53, 55, 355/67

(56) References Cited

U.S. PATENT DOCUMENTS

| | | | |
|---|---|---|---|
| 4,988,188 A | | 1/1991 | Ohta |
| 5,296,892 A | | 3/1994 | Mori |
| 5,329,336 A | | 7/1994 | Hirano et al. |
| 5,357,312 A | | 10/1994 | Tounai |
| 5,631,721 A | | 5/1997 | Stanton et al. |
| 5,724,122 A | * | 3/1998 | Oskotsky ..................... 355/67 |
| 5,895,737 A | | 4/1999 | McCullough et al. |
| 5,896,188 A | * | 4/1999 | McCullough ................ 355/67 |
| 5,966,202 A | | 10/1999 | McCullough |
| 6,013,401 A | | 1/2000 | McCullough et al. |
| 6,259,513 B1 | * | 7/2001 | Gallatin et al. .............. 355/71 |
| 6,573,975 B2 | * | 6/2003 | Govil et al. .................. 355/52 |
| 2001/0043318 A1 | | 11/2001 | Mori |
| 2001/0046038 A1 | * | 11/2001 | Mulkens et al. ............. 355/67 |
| 2002/0014600 A1 | | 2/2002 | Sato et al. |

FOREIGN PATENT DOCUMENTS

EP  1 248 151 A2  10/2002

OTHER PUBLICATIONS

Derwent Abstract Accession No. 96–385544/39; Class P81, P84; English Language Abstract of DE 196 06 170 A1; (Sharp KK); Aug. 22, 1996; 1 page.
Derwent Abstract Accession No. 2002–037678/05; Class P84; English Language Abstract of JP 2001–267205 A; (NEC Corp); Sep. 28, 2001; 1 page.
Derwent Abstract Accession No. 2000–611651/58; Class P84, U11; English Language Abstract of WO 200057459–A1 (Nikon Corp); Sep. 28, 2000; 2 pages.
Search Report from Intellectual Property Office of Singapore, issued Nov. 20, 2003 for Appl. No. SG 200302351–2, 5 pages.

* cited by examiner

Primary Examiner—Rodney Fuller
(74) Attorney, Agent, or Firm—Sterne, Kessler, Goldstein & Fox P.L.L.C.

(57) ABSTRACT

A system and method for improving line width control in a lithography device are presented. Electromagnetic energy is emitted from an illumination source and passed through illumination optics. The illumination optics include a partial coherence adjuster having a first and second optical element. The first optical element is used for changing the partial coherence of incident electromagnetic energy in a predetermined manner to compensate for horizontal and vertical line biases of the lithography device. The second optical element is used for changing the angular distribution of electromagnetic energy incident upon the first optical element. Together, the two optical elements are used to vary the partial coherence of the electromagnetic energy emitted by the illumination source, as a function of illumination field position, and improve line width control. Adjustment of the second optical element allows for correction of time-dependant line width variances.

33 Claims, 11 Drawing Sheets

SYSTEM AND METHOD FOR IMPROVING LINE WIDTH CONTROL IN A LITHOGRAPHY DEVICE USING AN ILLUMINATION SYSTEM HAVING PRE-NUMERICAL APERTURE CONTROL

CROSS-REFERENCE TO RELATED APPLICATIONS

The following application of common assignee is related to the present application, and is herein incorporated by reference in its entirety:

"System and Method for Improving Linewidth Control in a Lithography Device by Varying the Angular Distribution of Light in an Illuminator as a Function of Field Position," Ser. No. 10/127,505, filed on Aug. 23, 2002.

FIELD OF THE INVENTION

This invention relates to photolithography. More particularly, it relates to line width control in a photolithography device.

BACKGROUND OF THE INVENTION

Lithography is used in the manufacture of semiconductor chips. Lithography, or more particularly photolithography, involves projecting one or more images of a reticle or semiconductor circuit mask onto a photosensitive substrate of a wafer. The wafer is then processed to form one or more circuits. As the art of semiconductor chip manufacturing progresses and the size of semiconductor devices become smaller, there is a need for improving line width control in photolithography devices.

Large semiconductor chips are typically manufactured using a step-and scan lithography device. A step-and-scan lithography device operates by scanning a typically rectangular illumination field defined by an illumination system over a reticle having a circuit pattern thereon. A step-and-scan lithography device is used to manufacture large semiconductor chips, in part, because the size of a semiconductor chip that can be manufactured using a step-and-scan lithography device is not limited to the size of the device's projection optics.

A method and system for improving line width control, for example, in a step-and-scan lithography device, is described by McCullough et al. in U.S. application Ser. No. 09/599,383, filed Jun. 22, 2000, "Illumination System With Spatially Controllable Partial Coherence Compensating For Linewidth Variances In A Photolithography System," which is incorporated in its entirety herein by reference. McCullough et al. describe using a custom-designed optical element, such as a microlens array or a diffractive optical element, to control the partial coherence of an illumination system of a lithography device and thereby compensate for line width variances in the lithography device. The custom-designed optical element described by McCullough et al. is designed to compensate for predetermined horizontal and vertical biases associated with a particular lithography device. A limitation of the method of McCullough et al., however, is that it is typically an expensive and time-consuming process to design and manufacture the custom-designed optical element described by McCullough et al. Thus, the custom-designed optical element described by McCullough et al. cannot be readily adjusted, for example, as the horizontal and vertical biases associated with a particular lithography device change with time.

Other types of lithography devices such as step-and-repeat lithography devices and field-stitching lithography devices also exhibit horizontal and vertical biases that cause line width variances. Compensating for the horizontal and vertical biases in these lithography devices and improving line width control is just as important as compensating for horizontal and vertical biases and improving line width control in a step-and-scan lithography device.

What is needed is a system and method for controlling line width variations in a lithography device that overcomes the limitations described above.

BRIEF SUMMARY OF THE INVENTION

The present invention provides a system and method for controlling line width variances in a lithography device. Electromagnetic energy is emitted from an illumination source. A portion of the emitted electromagnetic energy passes through an illumination optics module. The illumination optics module includes a partial coherence adjuster module having a first and a second optical element. These two optical elements are used together to vary the partial coherence of electromagnetic energy emitted by the illumination source, as a function of illumination field position. These two optical elements thereby control line width variances, including time varying variances, in the lithography device.

In an embodiment, the lithography device includes a reticle stage, a projection optics module, and a wafer stage. The reticle stage is positioned adjacent to the illumination optics module such that electromagnetic energy exiting the illumination optics module will illuminate a portion of a reticle held by the reticle stage. The projection optics module is optically located between the reticle stage and the wafer stage. Electromagnetic energy passing through a reticle held by the reticle stage will enter the projection optics module and be imaged by the projection optics module on a photosensitive substrate, such as a wafer held by the wafer stage.

In an embodiment, the first optical element is a standard optical element designed to compensate for horizontal and vertical biases associated with lithography devices of a particular make and model. This standard optical element is not customized based on the horizontal and vertical biases associated with a particular lithography device. The second optical element is used for making any changes in the angular distribution of electromagnetic energy incident upon the first optical element needed to compensate for horizontal and vertical biases associated with a particular lithography device.

In another embodiment, the first optical element is a custom optical element designed to compensate for predetermined horizontal and vertical biases associated with a particular lithography device. This custom optical element is not intended to be interchangeable in other lithography devices. In this embodiment, the second optical element is used for making relatively minor changes in the angular distribution of electromagnetic energy incident upon the first optical element and thereby compensate for any changes in horizontal and vertical biases associated with a particular lithography device.

In an embodiment, the second optical element is made up of a set of lenslets. These lenslets can be arranged, for example, as a one-dimensional array of lenslets or as a two-dimensional array of lenslets. These lenslets can be replaced and/or repositioned in order to vary the angular distribution of electromagnetic energy incident upon the first optical element.

In an embodiment, a two-dimensional array of lenslets is formed from a plurality of one-dimensional arrays of lenslets. Each one-dimensional array of lenslets has different optical properties. Electromagnetic energy is passed through a particular one-dimension array of lenslets, selected from the plurality of one-dimensional arrays of lenslets, in order to produce electromagnetic energy having a particular angular distribution.

In an embodiment, each of the lenslets that makeup the two-dimensional array of lenslets can be individually selected and used to control the angular distribution of electromagnetic energy incident upon said second optical element.

In an embodiment, a coherence control module is used for selecting among the lenslets. A memory, coupled to the coherence control module, is used for storing data needed to select among the lenslets.

In another embodiment of the invention, the second optical element is a diffractive optic. This diffractive optic can be replaced by other diffractive optics having different optical properties in order to vary the angular distribution of incident electromagnetic energy.

Further features and advantages of the present invention, as well as the structure and operation of various embodiments of the present invention, are described in detail below with reference to the accompanying drawings.

BRIEF DESCRIPTION OF THE DRAWINGS/FIGURES

The present invention is described with reference to the accompanying figures. The accompanying figures, which are incorporated herein and form part of the specification, illustrate the present invention and, together with the description, further serve to explain the principles of the invention and to enable a person skilled in the relevant art to make and use the invention. In the figures, like reference numbers indicate identical or functionally similar elements. Additionally, the leftmost digit or digits of a reference number identify the figure in which the reference number first appears.

Figure 11A:
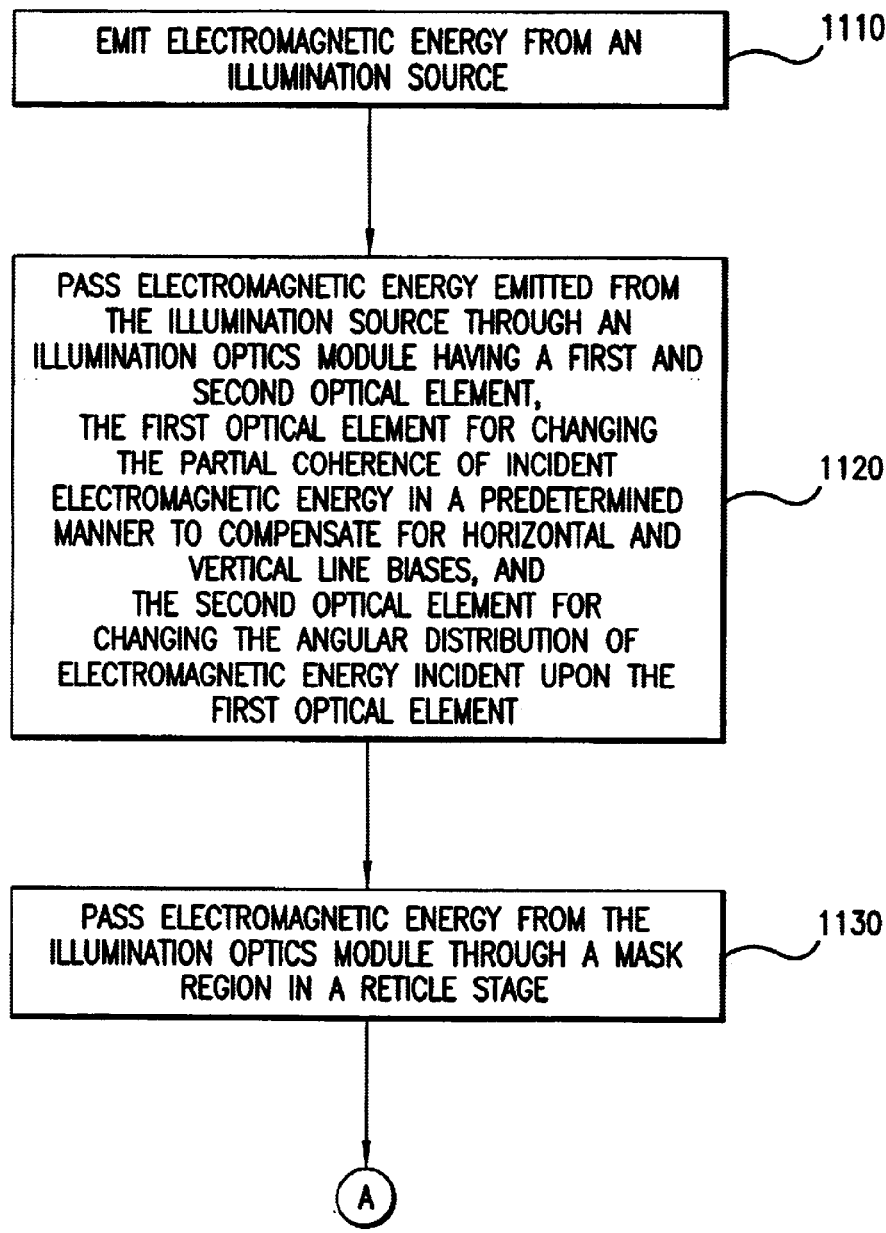
Figure 11B:
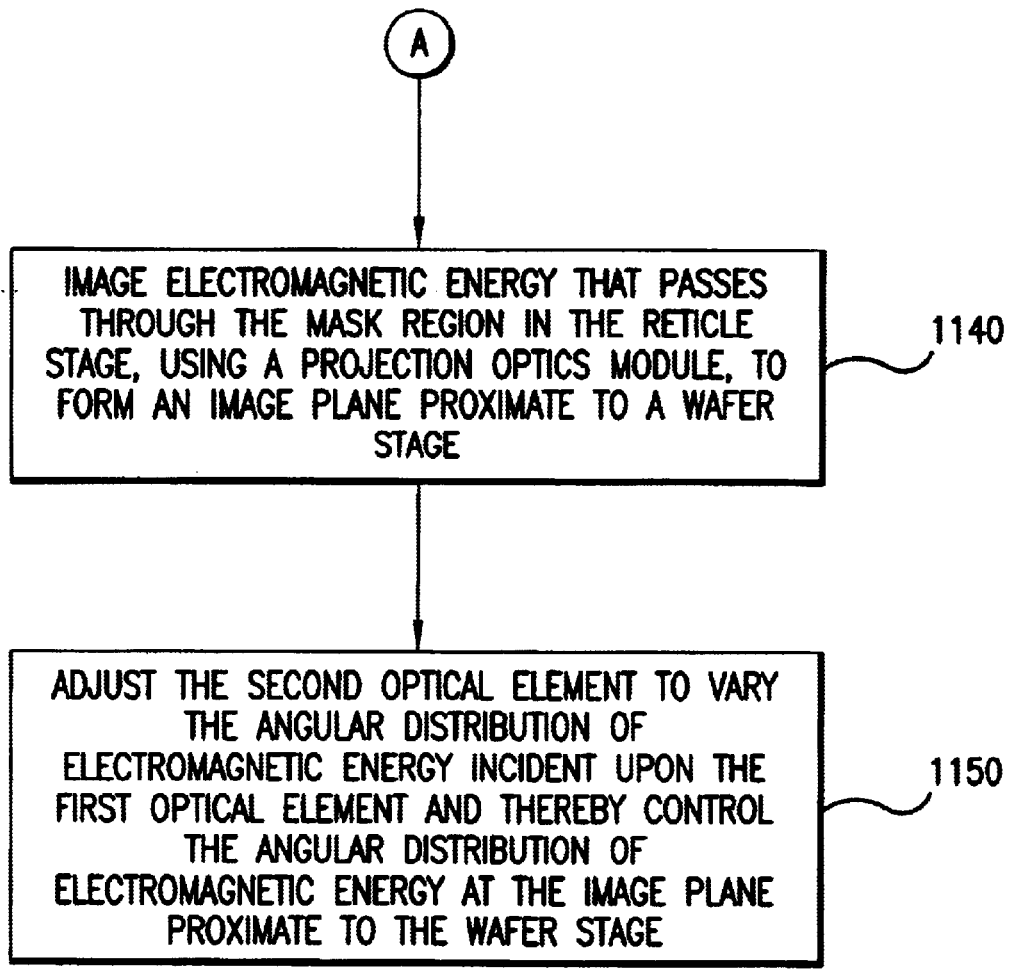

FIGS. 11A–B illustrate a flowchart of a method for controlling the angular distribution of electromagnetic energy in a lithography device as a function of field position according to an embodiment the invention.

DETAILED DESCRIPTION OF THE PREFERRED EMBODIMENTS

The present invention provides a system and method for improving linewidth control in a lithography device. As will be apparent from the detailed description herein, the present invention is particularly well adapted for use with a step-and-scan lithography device.

In the description that follows, reference will be made in detail to present embodiments of the invention, examples of which are illustrated in the accompanying drawings. While the invention will be described in conjunction with the present embodiments, it will be understood that they are not intended to limit the invention to just these embodiments. On the contrary, the invention is intended to cover alternatives, modifications and equivalents, which can be included within the spirit and scope of the invention as defined by the appended claims. Furthermore, in the following description, for purposes of explanation, numerous specific details are set forth in order to provide a thorough understanding of the present invention. It will be apparent, however, to one skilled in the art, upon reading this disclosure, that the present invention can be practiced without these specific details. In other instances, well-known structures and devices are not described in detail in order to avoid obscuring aspects of the present invention.

Terminology

The following terms are defined so that they may be used to describe embodiments of the present invention. As used herein:

"Adjustable Optical Element" means one or more optical components such as, for example, lenslets or gratings that can be changed, either automatically or manually, in order to bring about a change of partial coherence. A group of lenslets that can be switched into and out of an illumination path of a lithography device is an example of an adjustable optical element.

"Customized Optical Element" means an optical element specifically as designed to compensate for the optical characteristics of a particular lithography device. Customized optical elements are not intended to be used in a lithography device other than the one for which it is specifically designed.

"Diffractive element" or "diffractive optic" means a device capable of causing diffraction of electromagnetic energy. Diffractive optics include transmission gratings and reflection gratings.

"Illumination source" means any source of illumination such as, for example, a continuous or pulsed laser that is suitable for performing lithography.

"Lithography device" means any lithography device to include a step-and-scan lithography device, a step-and-repeat lithography device, and/or a field-stitching lithography device, unless otherwise noted.

"Positioned adjacent to" means a first module or device is positioned relative to a second module or device so that electromagnetic energy exiting the first module or device will enter the second module or device, either directly or indirectly. The phrase "positioned adjacent to" includes instances where one or more optical elements are used to direct electromagnetic energy exiting the first module or device into the second module or device.

"Replaceable Optical Element" means one or more optical components such as, for example, lenslets or gratings that can be replace by one or more optical components in order to bring about a change of partial coherence. A group of lenslets or a grating that can be replaced by another group of lenslets or another grating, having different optical properties, is an example of a replaceable optical element.

"Reticle stage" means that portion of a lithography device used to hold and position a reticle or semiconductor mask.

"Standardized Optical Element" means an optical element designed to compensate for the optical characteristics particular to a specific make or model of a lithography device. Standardized optical elements are intended to be used interchangeably in all lithography devices conforming to a specific make or model.

"Wafer" or "Photosensitive Substrate" both mean a wafer having a photosensitive coating of the type used by semiconductor manufacturers to produce semiconductor chips.

"Wafer stage" means that portion of a lithography device used to hold and position a wafer.

System Embodiments of the Invention

Figure 1:
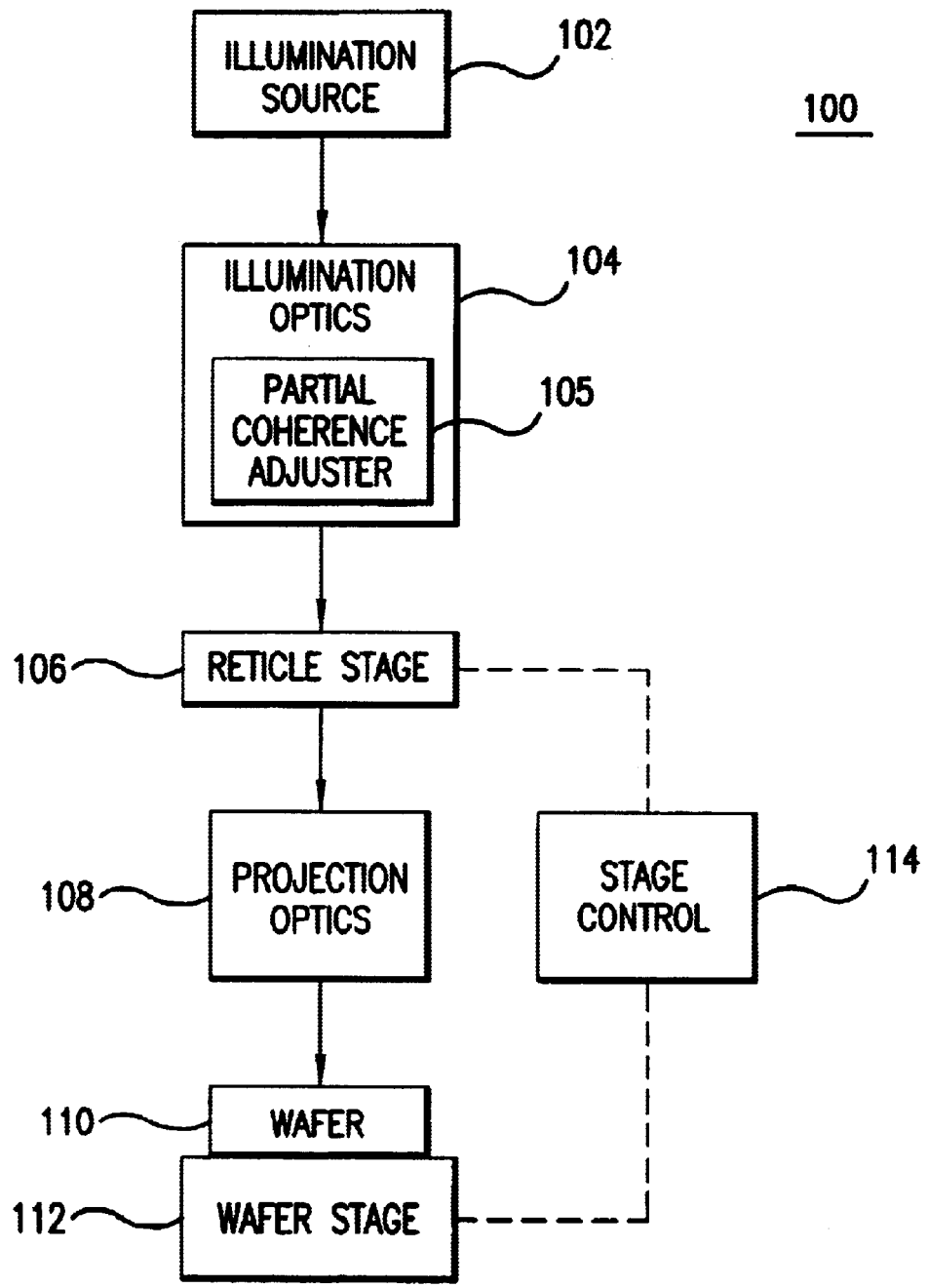
FIG. 1 illustrates an example lithography device that incorporates the invention.

FIG. 1 illustrates an example lithography device 100 that embodies the invention. An illumination source 102 generates and directs electromagnetic energy into an illumination optics module 104. Illumination optics module 104 includes a partial coherence adjuster module 105 that conditions the electromagnetic energy received from illumination source 102 in accordance with the invention. Conditioned electromagnetic energy leaves illumination optics module 104 and passes through a reticle (not shown) held by a reticle stage 106. The reticle is used to project an image of a circuit onto a wafer or photosensitive substrate 110. Electromagnetic energy passing through the reticle enters a projection optics module 108. Projection optics module 108 images the received electromagnetic energy on photosensitive substrate 110. Photosensitive substrate 110 is held and moved by a wafer stage 112. A stage control 114 controls the position of reticle stage 106 and wafer stage 112, thereby controlling the position of the reticle (not shown) and photosensitive substrate 110.

Illumination source 102 comprises a source of electromagnetic energy. Illumination source 102 can be either a continuous source of electromagnetic energy or a pulsed source of electromagnetic energy. For example, a pulsed laser operating in a range from about one kilohertz to about four kilohertz can be used. As will be understood by a person skilled in the relevant lithography art, the electromagnetic energy produced by illumination source 102 requires conditioning before it is used to expose photosensitive substrate 110.

Illumination optics module 104 comprises optical elements that condition the electromagnetic energy received from illumination source 102. Optical elements that form a part of illumination optics module 104 are described below and, for example, in U.S. Pat. No. 5,631,721 to Stanton et. al., which is herein incorporated by reference in its entirety. In particular, illumination optics module 104 contains a partial coherence adjuster module 105. Partial coherence adjuster module 105 contains optical elements for varying the angular distribution of electromagnetic energy emitted by illumination source 102 as a function of field position (e.g., for varying the angular distribution of electromagnetic energy of illumination field 312, as described below). In embodiments, partial coherence adjuster module 105 contains a customized or standardized optical element and either a set of lenslets or a diffractive optic for varying the angular distribution of electromagnetic energy emitted by illumination source 102 as a function of illumination field position. These features of the invention are described below in more detail.

Electromagnetic energy exiting illumination optics module 104 is used to illuminate a reticle (not shown) held by reticle stage 106. By illuminating the reticle, a circuit pattern thereon is transferred to photosensitive substrate 110. Photosensitive substrate 110 is processed in a manner known to persons skilled in the lithography arts to form one or more circuits.

Projection optics module 108 is used to image electromagnetic energy that passes through the reticle onto photosensitive substrate 110. Projection optics 108 can also be used to reduce the reticle image formed on photosensitive substrate 110.

Stage control 114 controls the movement and positioning of reticle sage 106 and wafer stage 112. Stage control 114 enables lithography device 100 to operate in either a step-and-scan mode, a step-and-repeat mode, and/or a field stitching mode.

Figure 2:
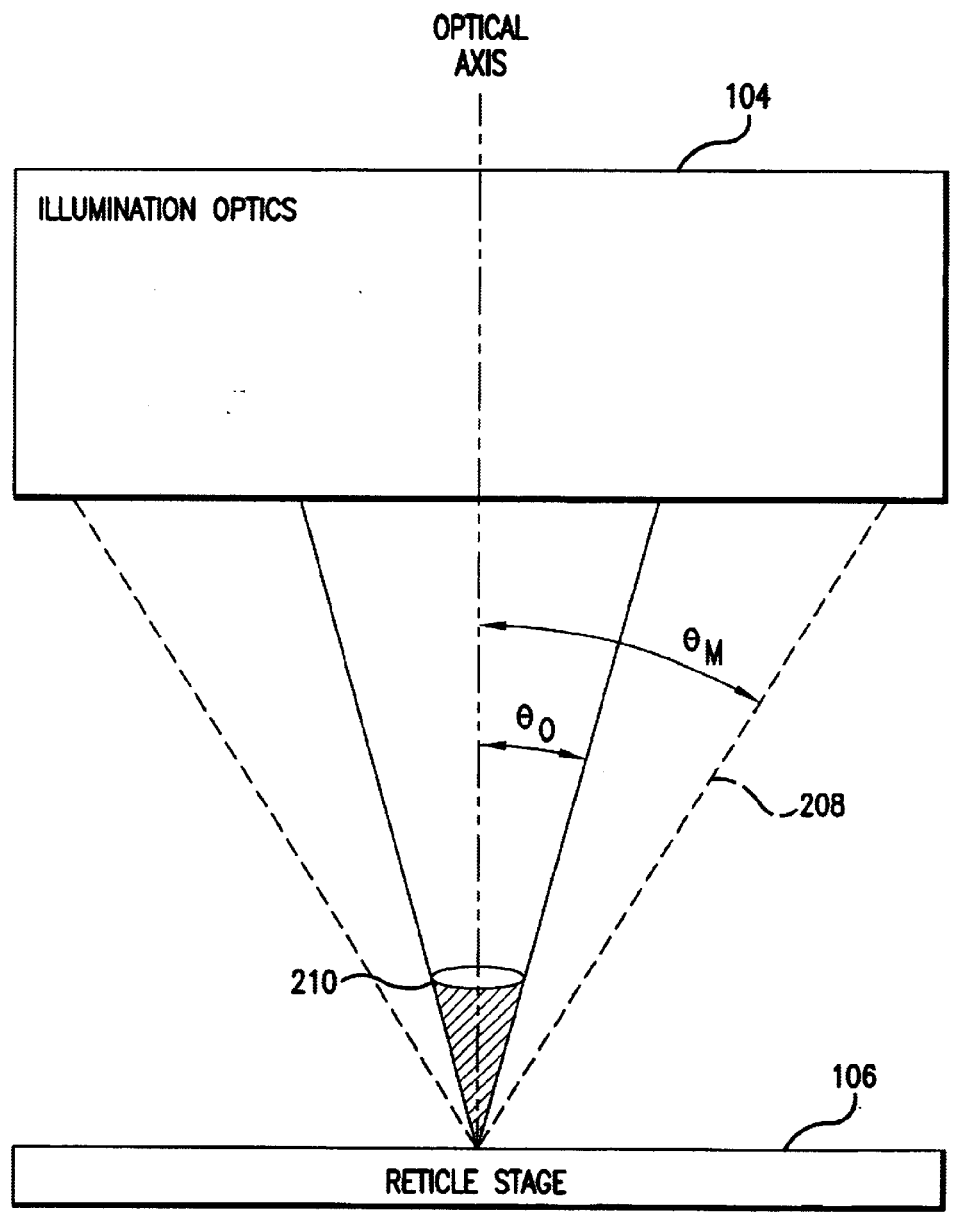
FIG. 2 illustrates how to measure the partial coherence of the lithography device of FIG. 1.

FIG. 2 illustrates how to measure the partial coherence of lithography device 100. Two cones 208 and 210 are shown in FIG. 2. Cone 210 represents the actual space through which electromagnetic energy from illumination source 102 passes to illuminate a reticle held by reticle stage 106. Cone 208 represents the maximum cone or space through which electromagnetic energy can pass and still be used to image wafer 110. The angular distribution of cone 210 (i.e., the partial coherence factor σ of cone 210) is given by EQ. 1:

$$\sigma = \frac{\theta_0}{\theta_m} \qquad \text{EQ. 1}$$

where, as shown in FIG. 2, cone 208 forms an angle $\theta_m$ with a optical axis of lithography device 100, and cone 210 forms an angle $\theta_0$ with the optical axis.

Figure 3:
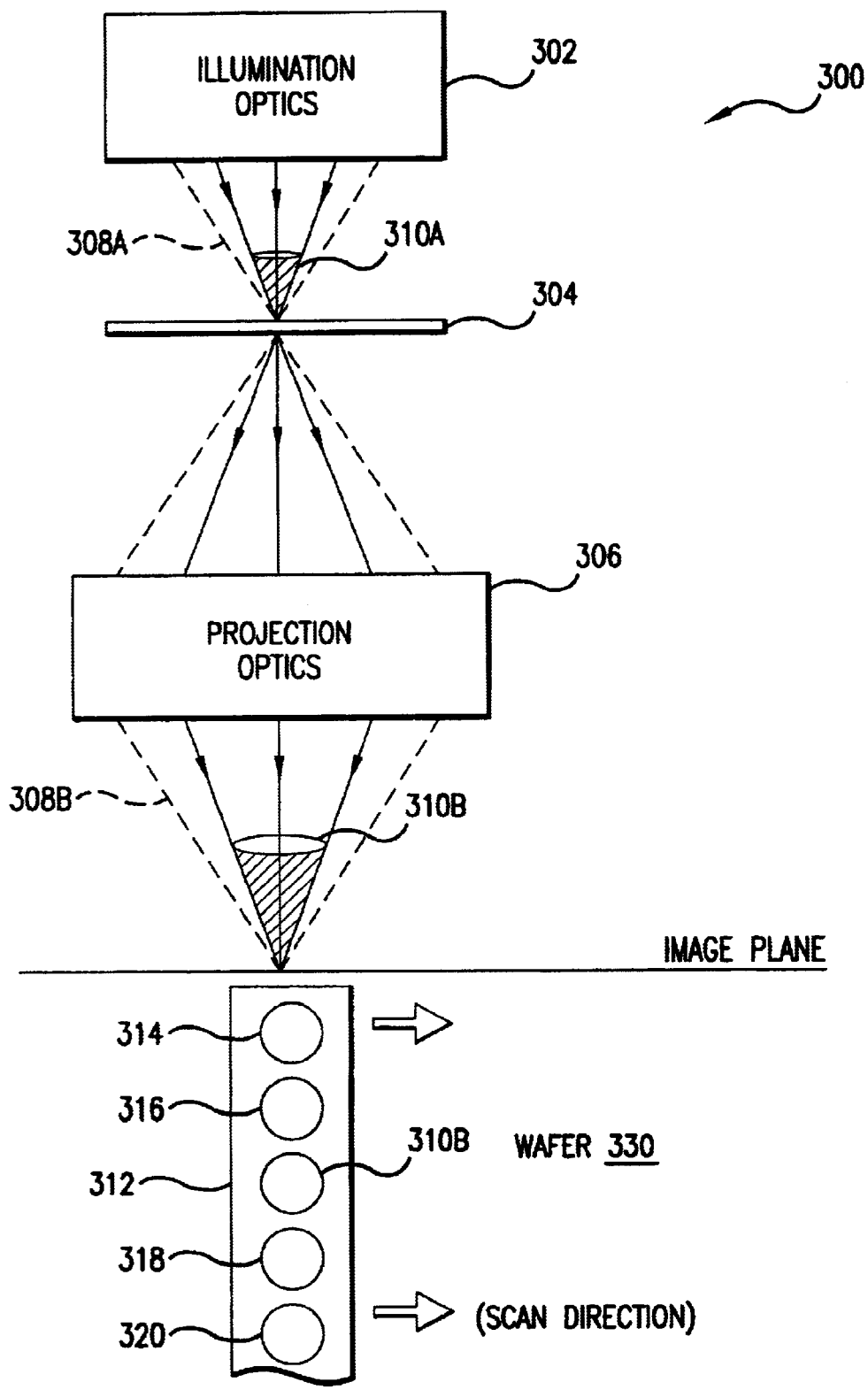
FIG. 3 illustrates the angular distribution of light in a conventional lithography device as a function of field position.

FIG. 3 illustrates the angular distribution of light in a conventional lithography device 300 as a function of field position. In FIG. 3, electromagnetic energy is shown exiting an illumination optics module 302. This exiting electromagnetic energy has not been conditioned in accordance with the invention. The exiting electromagnetic energy passes through a reticle stage 304. A reticle or semiconductor mask (not shown) is placed at an image plan of reticle stage 304. The exiting electromagnetic energy passes through a projection optics module 306. Projection optics module 306 images electromagnetic energy at an image plane located proximate to a wafer stage.

As illustrated in FIG. 3, the electromagnetic energy exiting illumination optics module 302 forms cones of electromagnetic energy (see, e.g., cone 310A). Similar cones of electromagnetic energy (see, e.g., cone 310B) are also formed by the electromagnetic energy as it exits projection optics module 306. These cones of electromagnetic energy (represented as cones 310B, 314, 316, 318, and 320) form an illumination field 312. Illumination field 312 is used to expose a photosensitive substrate of a wafer 330.

Illumination field 312 does not vary as a function of field position. Each cone of electromagnetic (e.g., 310B, 314, 316, 318, and 320) that forms a part of illumination field 312 exposes a different point on wafer 330. Cone 308B illustrates a maximum cone of electromagnetic energy that can be used to expose the photosensitive substrate of wafer 330. This cone is also shown as cone 308A. The shape (i.e., cross-sectional view) of each cone of electromagnetic (e.g., 310B, 314, 316, 318, and 320) is intended to represent the partial coherence of the electromagnetic energy at a particular point in illumination field 312.

As shown in FIG. 3, there is a relationship between the cones 308A and 308B. Changing the shape of cone 310A causes a similar change to be brought about in cone 310B. Cones 308A and 310A can be used to calculate the partial coherence of lithography device 300.

Figure 4:
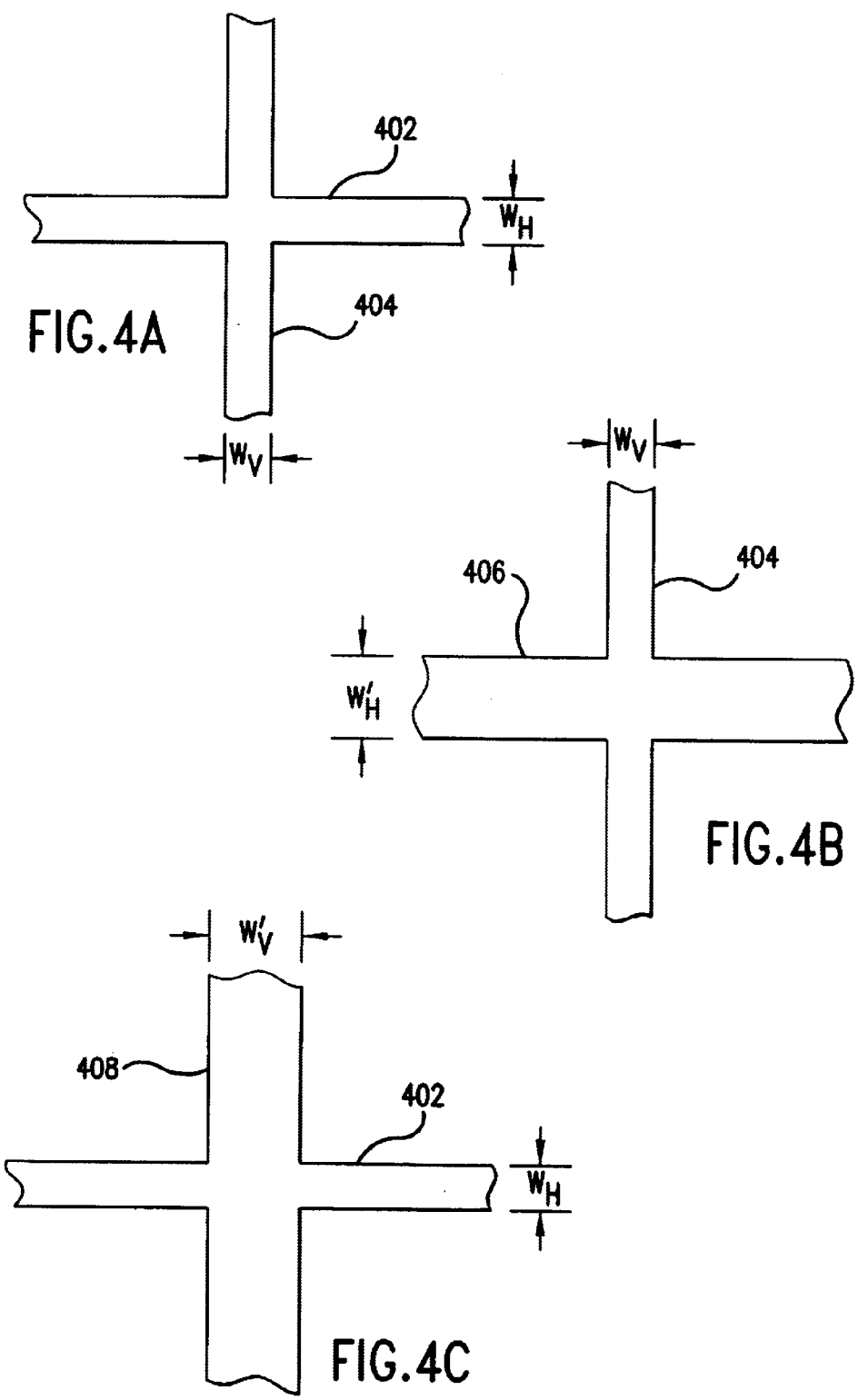
FIG. 4A illustrates an unbiased horizontal and an unbiased vertical line formed on a photosensitive substrate.
FIG. 4B illustrates a biased horizontal and an unbiased vertical line formed on a photosensitive substrate.
FIG. 4C illustrates an unbiased horizontal and a biased vertical line formed on a photosensitive substrate.

FIGS. 4A, 4B, and 4C illustrate horizontal line and vertical line biases. These line biases are brought about, for example, by imperfections in reticles and the optics of a conventional lithography device such as lithography device 300.

FIG. 4A illustrates an unbiased horizontal line 402 having a width $W_H$ and an unbiased vertical line 404 having a width $W_V$ formed on wafer 330.

FIG. 4B illustrates a biased horizontal line 406 having a width $W_H'$ and an unbiased vertical line 404 having a width $W_V$ formed on wafer 330.

FIG. 4C illustrates an unbiased horizontal line 402 having a width $W_H$ and a biased vertical line 408 having a width $W_V'$ formed on wafer 330.

As will become apparent to persons skilled in the relevant lithography art given the description herein, the present invention can be used to control the angular distribution or partial coherence of the electromagnetic energy in illumination field 312, as a function of field position, and thereby improve the performance of lithography device 300. By varying the partial coherence of the electromagnetic energy used to expose wafer 330 (e.g., the shape of cones 310B, 314, 316, 318, and 320) according to the invention, variations in line widths formed on wafer 330 are reduced. Embodiments of the invention are also used improve the performance of lithography devices other than lithography device 300 that use, for example, a square or an annular slit illumination field to expose a wafer.

Figure 5:
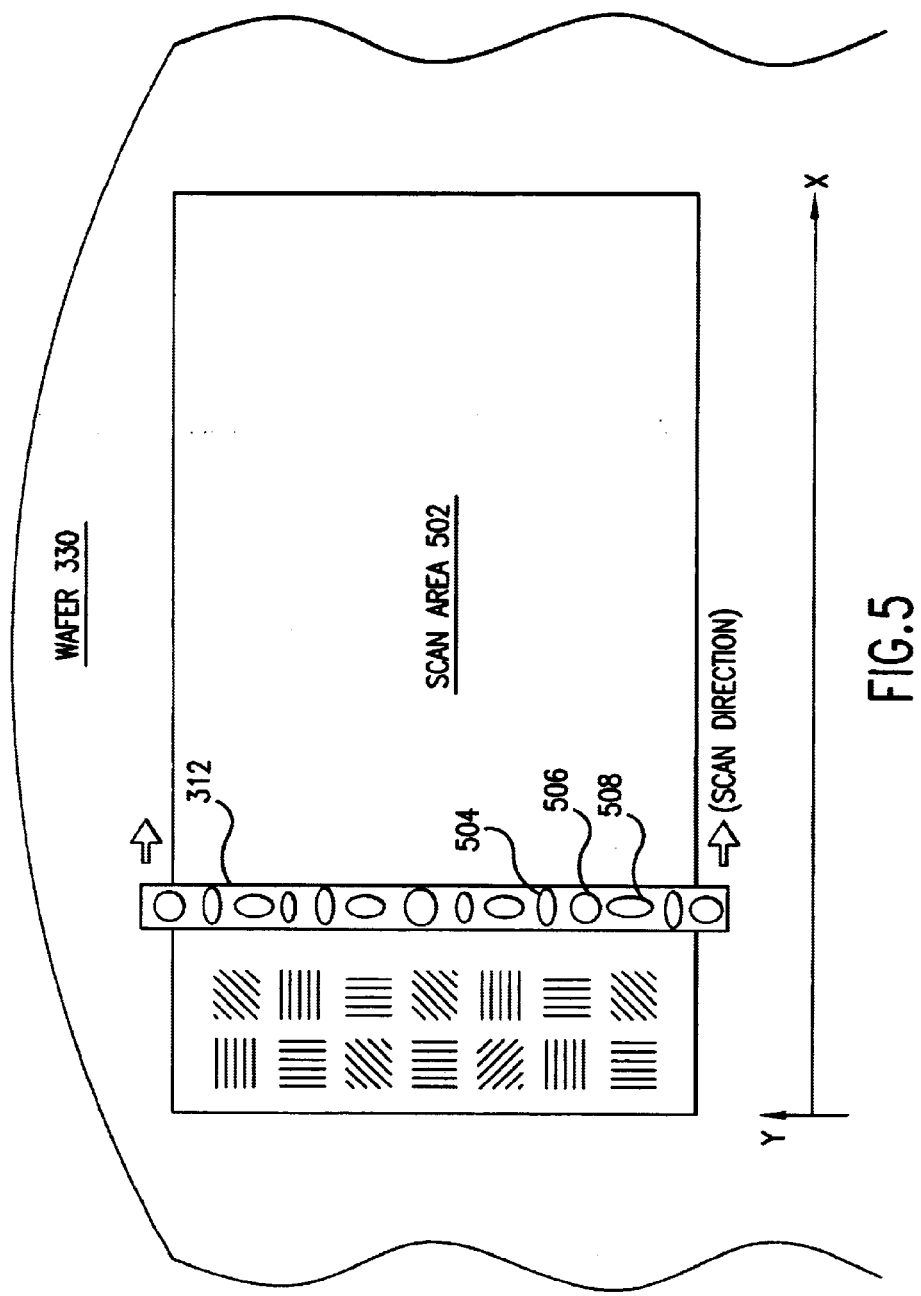
FIG. 5 illustrates an example relationship between a photosensitive substrate and an illumination field according to the invention.

FIG. 5 illustrates the relationship between wafer 330 and illumination field 312. FIG. 5 also illustrates how the invention can be used to vary the partial coherence of the electromagnetic energy used to expose wafer 330 (see, e.g., the shape of cones 504, 506, and 508) according to the invention, and thereby reduce variations in line widths formed on wafer 330.

As illustrated in FIG. 5, illumination field 312 is used to expose a scan area 502 of wafer 330. The partial coherence or angular distribution of electromagnetic energy in illumination field 312 varies as a function of field position. Each point of wafer 330 can be exposed differently along the length of illumination field 312 as illumination filed 312 scans across scan area 502. Illumination cones 504, 506, and 508 depict how the angular distribution of electromagnetic energy (e.g., light) can vary as a function of illumination field position in accordance with the invention.

Figure 6:
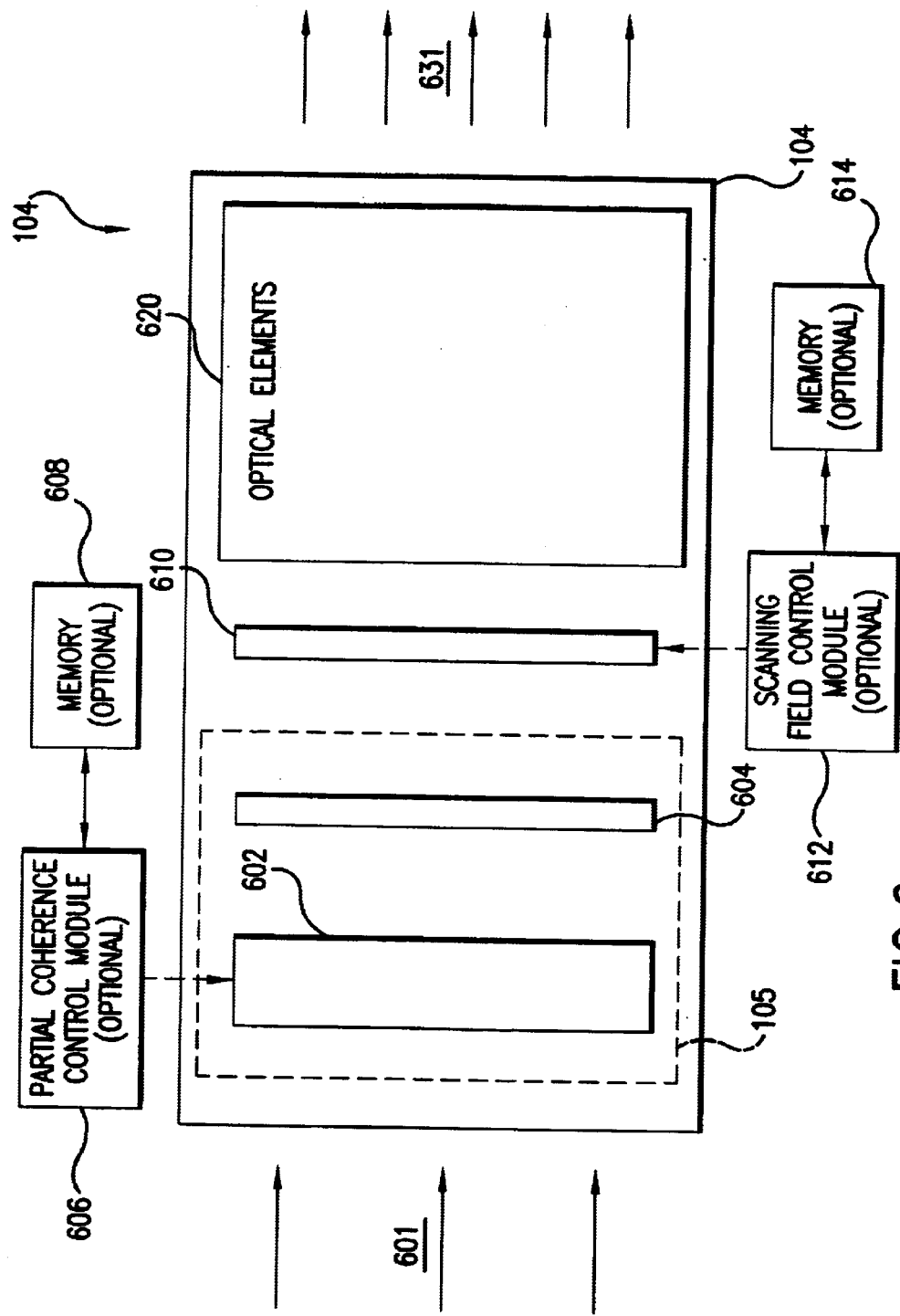
FIG. 6 illustrates an example illumination optics module according to the invention.

FIG. 6 further illustrates illumination optics module 104 according to an embodiment of the invention. Illumination optics module 104 includes partial coherence adjuster module 105, an illumination field delimiter 610, and optical elements 620. As described herein, electromagnetic energy 601 enters illumination optics module 104 from illumination source 102. Partial coherence adjuster module 105 is used to adjust the partial coherence of electromagnetic energy 601 as a function of illumination field position (e.g., illumination field 312) and thereby transform electromagnetic energy 601 into electromagnetic energy 631. Electromagnetic energy 631 exits illuminations optics module 104 towards reticle stage 106.

As shown in FIG. 6, partial coherence adjuster module 105 includes an adjustable or replaceable optical element 602 and a customized or standardized optical element 604. Optical element 604 is used for changing the partial coherence of incident electromagnetic energy in a predetermined manner to compensate for horizontal and vertical line biases. Optical element 602 is used for changing the angular distribution of electromagnetic energy incident upon optical element 604. In embodiments of the invention, optical element 602 comprises a set of lenslets. In other embodiments, optical element 602 comprises an array of diffractive optics.

A customized or standardized optical element 604 is used to modify the partial coherence of electromagnetic energy emitted by illumination source 102. Optical element 604 comprises, for example, micro lenses or diffractive elements that change the partial coherence of the electromagnetic energy incident upon optical element 604. Optical element 604 is designed to compensate for changes in the partial coherence of electromagnetic energy brought about, for example, by imperfections in projection optics module 108 that lead to horizontal and vertical line width biases.

A customized optical element 604 is described in detail in U.S. patent application Ser. No. 09/599,383 by McCullough et al.

Designing optical element 604 to compensate for the average or typical imperfections of a particular model of lithography devices has many advantages. For example, it reduces production costs and production time. When used in combination, optical elements 602 and 604 can compensate for any imperfections that cause horizontal line and vertical line biases. By replacing and/or adjusting optical element 602, the combination of optical elements 602 and 604 can also compensate for time-varying phenomena that cause horizontal line and vertical line biases.

As will be understood by a person skilled in the relevant lithography art given the description herein, the design of the optical elements 602 and 604 needed to control line width variations for a particular set of parameters can be determined based on analysis of experimental data obtain from exposing several wafers over time and under different conditions. The data needed can be obtained, for example, by analyzing the variations in printed line widths formed on wafers and the corresponding line widths on the reticles used to expose the wafers. How to collect the data and analyze the data are known to persons skilled in the relevant arts.

In embodiments of the invention, optical element 602 is adjusted based on detected variations in printed line widths formed on a photosensitive substrate (wafer 110) held by wafer stage 112. The detected variations in printed line widths can be compared to the reticle used to expose the photosensitive substrate, and the appropriate adjustments needed to reduce the variations in line widths for the reticle determined. In other embodiments, optical element 602 is adjusted based on detected variations in time-varying parameters. Time-varying parameters that may cause linewidth variations include temperature, pressure, and resist being used. Other time-varying parameters are known to persons skilled in the relevant lithography art. This detection and analysis process can be done on a continuous real-time basis, or it can be done periodically (e.g., from time-to-time).

As shown in FIG. 6, some embodiments of the invention include an optional partial coherence control module 606 and an optional memory 608. The purpose and function of these devices is described below with regard to the embodiment of the invention illustrated in FIG. 10.

Illumination field delimiter 610 is used to set the maximum size and shape of the illumination field used to expose wafer 330. In embodiments of the invention, the size and shape of the illumination field formed by delimiter 610 is controlled by an optional scanning field control module 612 and an optional memory 614. This feature is used, for example, to control the amount of electromagnetic energy used to image a particular reticle.

Optical elements 620 represent additional reflective and/or refractive optical elements used to route and/or condition the electromagnetic energy. The optical elements that form a part of optical elements 620 are known to persons skilled in the relevant art.

Figure 7:
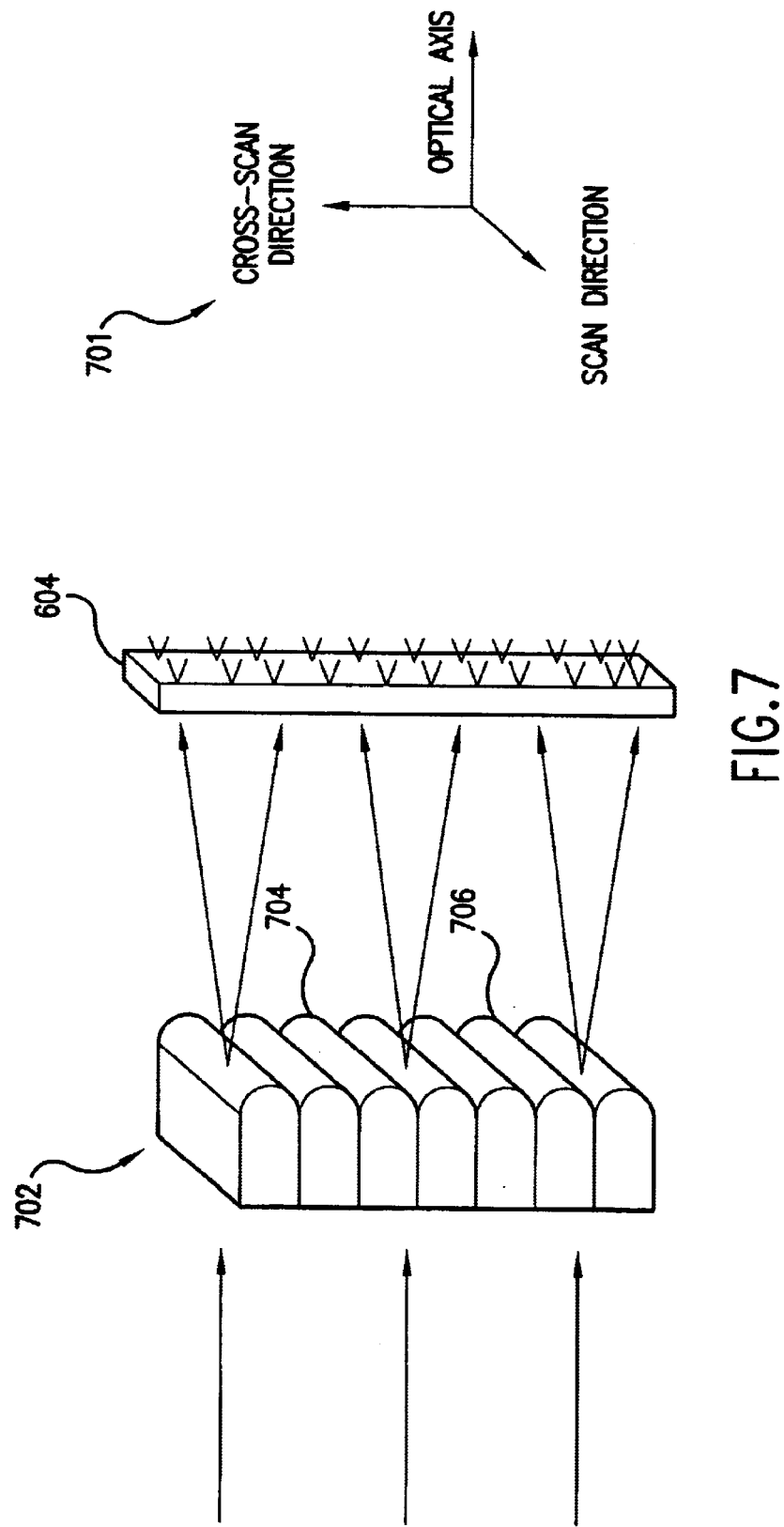
FIG. 7 illustrates an example partial coherence adjuster according to an embodiment of the invention.

As described herein, in embodiments of the invention, optical element 602 is formed using lenslets. FIG. 7 illustrates an embodiment where a set of lenslets are arranged as a one-dimensional array of lenslets 702. The orientation of one-dimensional array of lenslets 702 in relationship to the optical axis, the scan direction, and the cross-scan direction of lithography device 300 is shown by key 701. Lenslets 704 and 706 are two example lenslets that makeup the one-dimensional array of lenslets 702. Electromagnetic energy entering one-dimensional array of lenslets 702 is spread by the individual lenslets over customized or standardized optical element 604. More particularly, the lenslets of the array control the incident angle of the electromagnetic energy at any point on optical element 604 in order to control the exiting angular distribution of electromagnetic energy from optical element 604. The effect is to convolve the numerical aperture from optical element 604 with that of optical element 602, and thereby increase the overall numerical aperture of partial coherence adjuster module 105.

Figure 8:
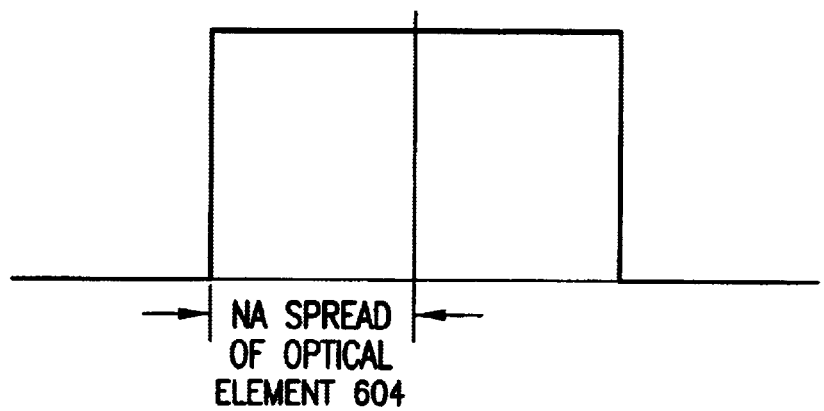
FIG. 8 illustrates an example numerical aperture spread of an optical element used to adjust coherence according to an embodiment of the invention.

FIG. 8 illustrates an example numerical aperture spread from optical element 604, in a cross-scan direction of a step-and scan lithography device, when illuminated with collimated electromagnetic energy (e.g., when no lenslets are present).

Figure 9:
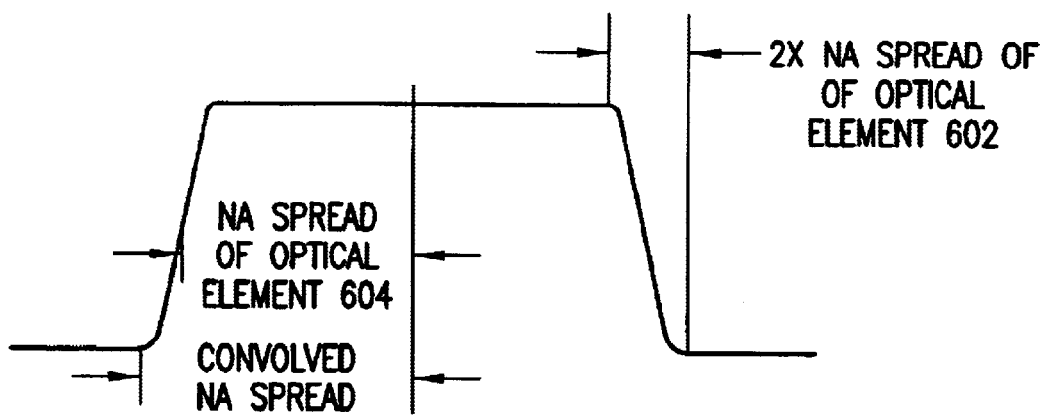
FIG. 9 illustrates an example convolved numerical aperture spread of an optical element used to adjust coherence according to an embodiment the invention.

FIG. 9 illustrates an example convolved numerical aperture spread from optical element 604, in a cross-scan direction of a step-and scan lithography device, when illuminated according to the invention (e.g., when lenslets are present).

As will be understood by a person skilled in the relevant art given the description herein, the spread of the electromagnetic energy exiting one-dimensional array of lenslets 702 is determined by the optical properties of all the individual lenslets of the array. Thus, by changing at least one lenslet of the array, one can vary or control the angular distribution or coherence of the electromagnetic energy exiting optical element 604. By changing the lenslets, or the entire array, one can compensate for time-varying phenomena that cause horizontal line and vertical line biases.

In embodiments of the invention, the set of lenslets that makeup optical element 602 is arranged as a two-dimensional array of lenslets. This arrangement has many advantages.

Figure 10:
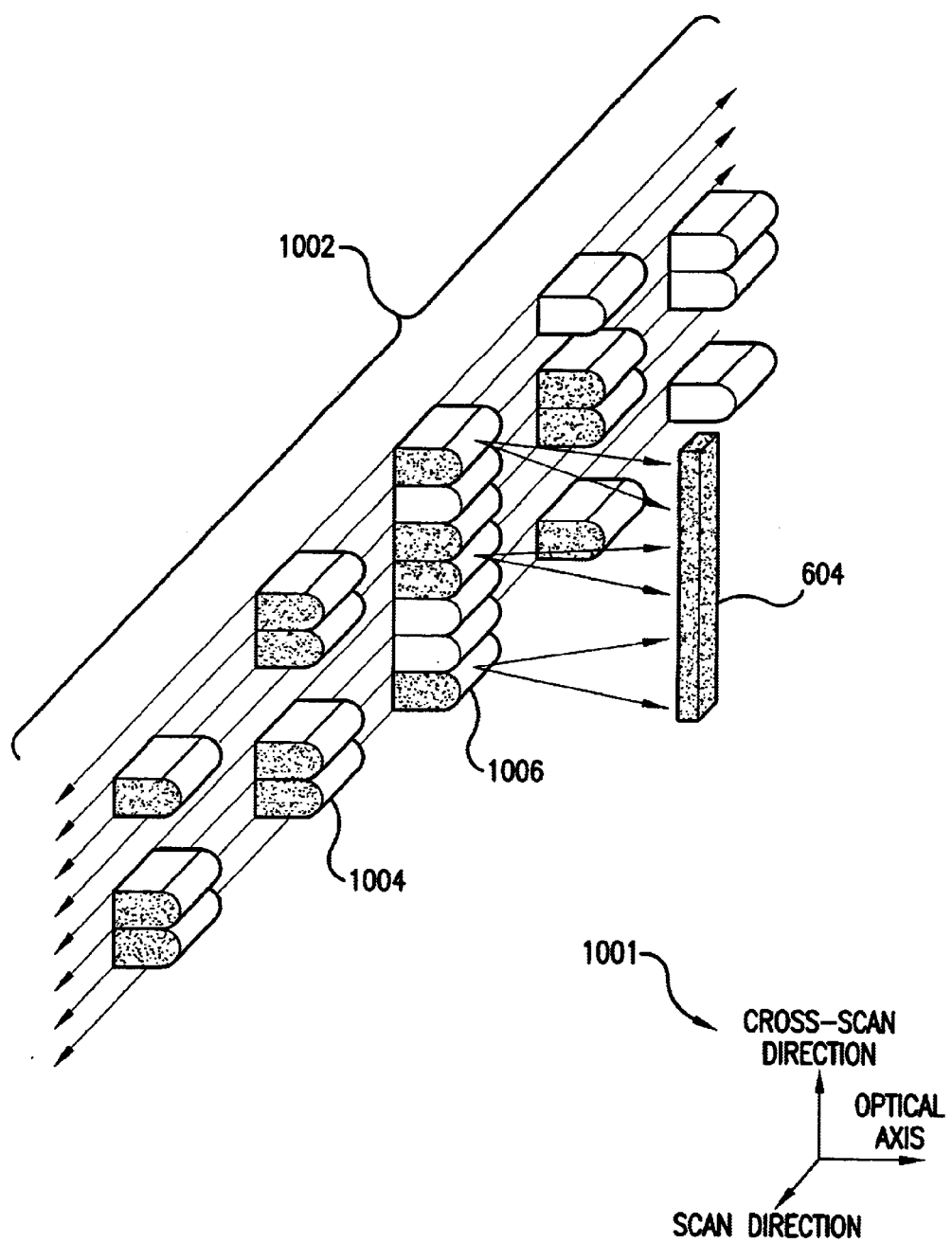
FIG. 10 illustrates a second example partial coherence adjuster according to an embodiment of the invention.

FIG. 10 illustrates a two-dimensional array of lenslets 1002. The orientation of two-dimensional array of lenslets 1002 in relationship to the optical axis, the scan direction, and the cross-scan direction of lithography device 200 is shown by key 1001. Two-dimensional array of lenslets 1002 can be formed, for example, from a plurality of one-dimensional arrays of lenslets. Typically, each one-dimensional array of lenslets will have different optical properties. Electromagnetic energy is passed through a particular one-dimension array of lenslets, as shown in FIG. 10, which is selected from the plurality of one-dimensional arrays of lenslets that make up the two-dimensional array. Each one-dimensional array of lenslets produces electromagnetic energy having a particular angular distribution.

In embodiments of the invention, partial coherence control module 606 controls the selection and positioning of lenslets. Partial coherence control module 606 is coupled to optical element 602 (e.g., the lenslets). Partial coherence control module 606 controls, for example, which of the plurality of one-dimensional arrays of lenslets is positioned to illuminate optical element 604. In embodiments, a memory 608 is coupled to partial coherence control module 606. Memory 608 stores, for example, data needed to select among the plurality of one-dimensional arrays of lenslets and position the selected one-dimensional array proximate to optical element 604. Partial coherence control module 606 can implement open or closed loop controls. In embodiments, partial coherence control module 606 is implemented using a micro-controller.

In embodiments, each of the lenslets that makeup a two-dimensional array of lenslets can be individually selected and used to control the angular distribution of electromagnetic energy incident upon first optical element 604. This can be accomplished, for example, by controlling each row of lenslets of the two-dimensional array of lenslets 1002 individually, rather than collectively, to position a particular lenslet of a row proximate to optical element 604. In an embodiment, each row of the two-dimensional array contains lenslets that produce varying degrees of electromagnetic energy spread. The lenslets having the desired or demanded spread, are actively switched (i.e., positioned) into the optical or illumination path of lithography device 300 so that they can be used to illuminate optical element 604. For example, lenslet 1004 can be switch into the illumination path for lenslet 1006. How to accomplish this switching will be understood by persons skilled in the relevant art given the description herein. In a manner similar to that described above, in embodiments of the invention, a partial coherence control module 606 coupled to a memory 608 controls the selection and positioning of individual lenslets.

In embodiments, optical element 602 comprises a diffractive element or optic. How diffractive elements or optics operate are understood by persons skilled in the relevant optical art. Any suitable diffractive element can be used in accordance with the invention.

As will be understood by a person skilled in the relevant art given the description herein, diffractive elements can be formed, for example, from an array of smaller diffractive elements. Thus, embodiments of the invention that use diffractive elements exhibit all of the advantages and features of the invention described above for embodiments having lenslets. Similar to lenslets, rows or columns of diffractive elements can be built up to vary the angular distribution of the electromagnetic energy used to illuminate optical element 604. These rows or columns can be adjusted, switched, or positioned similar to lenslets.

Method Embodiment of the Invention

FIGS. 11A and 11B illustrate a flowchart of the steps of a method 1100 for controlling the angular distribution of electromagnetic energy in a lithography device as a function of field position according to an embodiment the invention. The steps of method 1100 will now be described.

In step 1110, electromagnetic energy is emitted from an illumination source. The emitted electromagnetic energy (e.g., light) can be either a continuous source of electromagnetic energy or a pulsed source of electromagnetic energy. In an embodiment, a pulsed laser operating in a range from about one kilohertz to about four kilohertz is used.

In step 1120, electromagnetic energy emitted from the illumination source passes through an illumination optics module. This illumination optics module includes a partial coherence adjuster module. The partial coherence adjuster module includes a replaceable or adjustable optical element, such as optical element 602, and a customized or standardized optical element, such as optical element 604. As noted herein, the purpose of the optics module is to condition the electromagnetic energy so that is can be used to illuminate a reticle or mask and image a circuit pattern on a wafer.

As described herein, the first optical element, such as optical element 604, changes the partial coherence of incident electromagnetic energy in a predetermined manner to compensate for horizontal and vertical line biases. The second optical element, such as optical element 602, changes the angular distribution of electromagnetic energy incident upon the first optical element. When used in combination, the first and second optical elements can compensate for any imperfections that cause horizontal line and vertical line biases. By adjusting the second optical element, or replacing it with another optical element according to the invention, the combination of optical elements can be used to compensate for time-varying phenomena that cause horizontal line and vertical line biases.

In step 1130, electromagnetic energy from the illumination optics module passes through a mask region in a reticle stage. In operation, the mask region of the reticle stage holds a reticle or mask. By illuminating the reticle, a circuit pattern thereon is transferred to a photosensitive substrate of a wafer.

In step 1140, electromagnetic energy that passes through the mask region in the reticle stage is imaged, using a projection optics module, to form an image plane proximate to a wafer stage. In embodiments, the projection optics module reduces the size of the reticle features transferred to the photosensitive substrate. For example, in an embodiment, the projection optics module reduces the size of the reticle features transferred to the photosensitive substrate by a factor of four.

In step 1150, the second optical element is adjusted to control the angular distribution of electromagnetic energy at the image plane proximate to the wafer stage. In an embodiment, the second optical element is adjusted by replacing one or more components (e.g., lenslets) with one or more components having different optical properties. In other embodiments, the second optical element is adjusted by switching in and out one or more components used to illuminate the first optical element (e.g., lenslets or regions of a diffractive element). This switching can be controlled manually or automatically using one or more open or closed control loops.

As will be understood by a person skilled in the relevant lithography art, there are many factors that can be used to determine how, for example, the lenslets or diffractive elements used to vary the angular distribution of the electromagnetic energy incident on the first optical element should be adjusted in order to improve line width control in accordance with the invention. Thus, the factors discussed herein have been presented by way of example only, and not limitation.

Conclusion

Various embodiments of the present invention have been described above. It should be understood that these embodiments have been presented by way of example only, and not limitation. It will be understood by those skilled in the relevant art that various changes in form and details of the embodiments described above may be made without departing from the spirit and scope of the present invention as defined in the claims. Thus, the breadth and scope of the present invention should not be limited by any of the above-described exemplary embodiments, but should be defined only in accordance with the following claims and their equivalents.

What is claimed is:

1. A lithography system, comprising:
   an illumination source;
   an illumination optics module that receives electromagnetic energy emitted by said illumination source, said illumination optics module having a partial coherence adjuster module comprising:
      a first optical element that changes the partial coherence of incident electromagnetic energy in a predetermined manner to compensate for horizontal and vertical line biases, and
      a second optical element that changes the angular distribution of electromagnetic energy incident upon said first optical element;
   a reticle stage positioned adjacent to said illumination optics module, wherein electromagnetic energy exiting said illumination optics module will illuminate a portion of a reticle held by said reticle stage;
   a wafer stage; and
   a projection optics module having an image plane proximate to said wafer stage, said projection optics module positioned adjacent to said reticle stage and adjacent to said wafer stage, wherein electromagnetic energy passing through the reticle held by said reticle stage will enter said projection optics module and be imaged by said projection optics module on a photosensitive substrate on a wafer held by said stage.

2. The system of claim 1, wherein said second optical element comprises a set of lenslets.

3. The system of claim 2, wherein said set of lenslets is arranged as a one-dimensional array of lenslets.

4. The system of claim 3, wherein at least one lenslet in said set of lenslets is configured to be replaceable with another lenslet having different optical properties in order to vary the angular distribution of electromagnetic energy incident upon said first optical element.

5. The system of claim 2, wherein said set of lenslets is arranged as a two-dimensional array of lenslets.

6. The system of claim 5, wherein said two-dimensional array of lenslets is formed from a plurality of one-dimensional arrays of lenslets.

7. The system of claim 6, further comprising:
   a coherence control module, coupled to said second optical element, that selects among the plurality of one-dimensional arrays of lenslets.

8. The system of claim 7, further comprising:
   a memory, coupled to said coherence control module, that stored data used to select among the plurality of one-dimensional arrays of lenslets.

9. The system of claim 5, wherein individual ones of said plurality of lenslets are selected and used to control the angular distribution of electromagnetic energy incident upon said first optical element.

10. The system of claim 9, further comprising:
    a coherence control module, coupled to said second optical element, that selects and positions individual ones of said plurality of lenslets.

11. The system of claim 10, further comprising:
    a memory, coupled to said coherence control module, that stores data used to select among the individual lenslets.

12. The system of claim 2, wherein said second optical element is a diffractive optic.

13. The system of claim 12, wherein said diffractive optic comprises an array of diffractive optics.

14. A method for controlling the angular distribution of electromagnetic energy in a lithography device as a function of field position, the method comprising the steps of:

(1) emitting electromagnetic energy from an illumination source;

(2) passing electromagnetic energy emitted from the illumination source through an illumination optics module comprising a first and second optical element, wherein the first optical element changes the partial coherence of incident electromagnetic energy in a predetermined manner to compensate for horizontal and vertical line biases, and the second optical element changes the angular distribution of electromagnetic energy incident upon the first optical element;

(3) passing electromagnetic energy from the illumination optics module through a mask region in a reticle stage;

(4) imaging electromagnetic energy that passes through the mask region in the reticle stage, using a projection optics module, to form an image plane proximate to a wafer stage; and (5) adjusting the second optical element to vary the angular distribution of electromagnetic energy incident upon the first optical element to thereby control the angular distribution of electromagnetic energy at the image plane proximate to the wafer stage.

15. The method of claim 14, wherein step (5) comprises the step of:

replacing a first set of lenslets arranged as a one-dimensional array of lenslets with a second set of lenslets.

16. The method of claim 14, wherein step (5) comprises the step of:

selecting a particular one-dimension array of lenslets, from a plurality of one-dimensional arrays of lenslets arranged to form a two-dimensional array of lenslets, through which electromagnetic energy is passed.

17. The method of claim 14, wherein step (5) comprises the step of:

selecting individual lenslets, from a plurality of lenslets arranged to form a two-dimensional array of lenslets, through which electromagnetic energy is passed.

18. The method of claim 17, wherein step (5) further comprises the step of:

controlling the positioning of the individual lenslets with a coherence control module and a memory.

19. The method of claim 14, wherein step (5) comprises the step of:

replacing a first diffractive optic with a second diffractive optic having different optical properties.

20. The method of claim 14, wherein step (5) comprises the step of:

selecting regions of a diffractive optic array through which electromagnetic energy is passed.

21. An apparatus for improving line width control in a lithography device, comprising:

a first optical element that changes the partial coherence of incident electromagnetic energy, and a second optical element that changes the angular distribution of electromagnetic energy incident upon said first optical element to compensate for horizontal and vertical line biases associated with a particular lithography device.

22. The apparatus of claim 21, wherein said second optical element comprises a set of lenslets.

23. The apparatus of claim 22, wherein said set of lenslets is arranged as a one-dimensional array of lenslets.

24. The apparatus of claim 23, wherein at least one lenslet in said set of lenslets is configured to be replaceable with another lenslet having different optical properties in order to vary the angular distribution of electromagnetic energy incident upon said first optical element.

25. The apparatus of claim 22, wherein said set of lenslets is arranged as a two-dimensional array of lenslets.

26. The apparatus of claim 25, wherein said two-dimensional array of lenslets is formed from a plurality of one-dimensional arrays of lenslets.

27. The apparatus of claim 26, further comprising:

a coherence control module, coupled to said second optical element, that selects among the plurality of one-dimensional arrays of lenslets.

28. The apparatus of claim 27, further comprising:

a memory, coupled to said coherence control module, that stores data used to select among the plurality of one-dimensional arrays of lenslets.

29. The apparatus of claim 25, wherein individual ones of said plurality of lenslets are selected and used to control the angular distribution of electromagnetic energy incident upon said first optical element.

30. The apparatus of claim 29, further comprising:

a coherence control module, coupled to said second optical element, that selects and positions individual ones of said plurality of lenslets.

31. The apparatus of claim 30, further comprising:

a memory, coupled to said coherence control module, that stores data used to select among the individual lenslets.

32. The apparatus of claim 22, wherein said second optical element is a diffractive optic.

33. The apparatus of claim 22, wherein said diffractive optic comprises an array of diffractive optics.

* * * * *